US011198377B2

United States Patent
Hiratsuka

(10) Patent No.: US 11,198,377 B2
(45) Date of Patent: Dec. 14, 2021

(54) ELECTRIC VEHICLE POWER MANAGEMENT SYSTEM

(71) Applicant: ELETRA INDUSTRIAL LTDA, São Bernardo do Campo (BR)

(72) Inventor: Paulino Hiratsuka, São Bernardo do Campo (BR)

(73) Assignee: ELETRA INDUSTRIAL LTDA, São Bernardo Do Campo (BR)

( * ) Notice: Subject to any disclaimer, the term of this patent is extended or adjusted under 35 U.S.C. 154(b) by 318 days.

(21) Appl. No.: 16/481,005

(22) PCT Filed: Mar. 2, 2018

(86) PCT No.: PCT/BR2018/050055
§ 371 (c)(1),
(2) Date: Jul. 25, 2019

(87) PCT Pub. No.: WO2019/144205
PCT Pub. Date: Aug. 1, 2019

(65) Prior Publication Data
US 2021/0221250 A1    Jul. 22, 2021

(30) Foreign Application Priority Data
Jan. 26, 2018 (BR) .......................... 10 2018 001661

(51) Int. Cl.
*B60L 15/00* (2006.01)
*B60L 3/00* (2019.01)
(Continued)

(52) U.S. Cl.
CPC .............. *B60L 58/22* (2019.02); *B60L 3/003* (2013.01); *B60L 7/12* (2013.01); *B60L 50/66* (2019.02);
(Continued)

(58) Field of Classification Search
None
See application file for complete search history.

(56) References Cited

U.S. PATENT DOCUMENTS 5,813,487 A    9/1998   Lee et al.
7,147,070 B2   12/2006  Leclere
(Continued)

FOREIGN PATENT DOCUMENTS

| BR | 102014006100 A2 | 7/2016 |
| CA | 2836450 A1 | 6/2015 |
| EP | 2680434 A1 | 1/2014 |

OTHER PUBLICATIONS

International Search Report and Written Opinion issued in corresponding Application No. PCT/BR2018/050055 dated Jul. 9, 2019.

*Primary Examiner* — Jared Fureman
*Assistant Examiner* — Aqeel H Bukhari
(74) *Attorney, Agent, or Firm* — Ditthavong, Steiner & Mlotkowski

(57) ABSTRACT

The present invention relates to a power management system of a pure electric vehicle powered exclusively by batteries which allows the vehicle to carry a load of up to 13 tons, where the system of the present invention is provided with five blocks: a battery system (SBAT) (3), a control and power logic unit (ULCP) (4), a traction system (STR) (5), an auxiliary system (SAX) (36), and a driver's control panel (PCM) 81, where such blocks are interconnected by two buses, CAN bus (128) and Digital/Analogical BDA (129). The battery system has two battery banks (1) and (2) in parallel which are monitored by the BMS (76). The BMS (76) checks whether the voltages at the output of the batteries are the same as the input of the inverter (8) and manages the use of the battery banks in conjunction with the eVSI (73) by operating the battery bank (1) or the battery bank (2) or both depending on the load conditions of each
(Continued)

bank. The eVSI (73) coordinates the control and power logic unit (ULCP) (4) which, through its components, controls the flow of energy between the battery banks, the traction system (STR) (5) and the auxiliary system (SAX) (36).

18 Claims, 1 Drawing Sheet

(51) Int. Cl.

| | |
|---|---|
| *B60L 9/18* | (2006.01) |
| *H02P 27/06* | (2006.01) |
| *H02P 5/74* | (2006.01) |
| *B60L 58/22* | (2019.01) |
| *B60L 50/60* | (2019.01) |
| *B60L 53/16* | (2019.01) |
| *B60L 7/12* | (2006.01) |
| *B60R 16/023* | (2006.01) |
| *B60R 16/033* | (2006.01) |

(52) U.S. Cl.
CPC .......... *B60L 53/16* (2019.02); *B60R 16/0231* (2013.01); *B60R 16/033* (2013.01); *B60L 2210/10* (2013.01)

(56) References Cited

U.S. PATENT DOCUMENTS

| | | | |
|---|---|---|---|
| 7,338,335 | B1 | 3/2008 | Messano |
| 8,256,553 | B2 | 9/2012 | De Paschoal |
| 2013/0166119 | A1 | 6/2013 | Kummer et al. |
| 2013/0175022 | A1* | 7/2013 | King ................. B60H 1/00392 |
| | | | 165/202 |
| 2013/0221916 | A1 | 8/2013 | Kelty et al. |
| 2014/0046524 | A1 | 2/2014 | Brown |
| 2016/0129803 | A1* | 5/2016 | Grewal ................. B60L 50/16 |
| | | | 701/22 |
| 2016/0159339 | A1 | 6/2016 | Cho et al. |
| 2016/0318501 | A1 | 11/2016 | Oldridge |
| 2017/0144553 | A1* | 5/2017 | Steele .................... B60L 58/22 |

\* cited by examiner

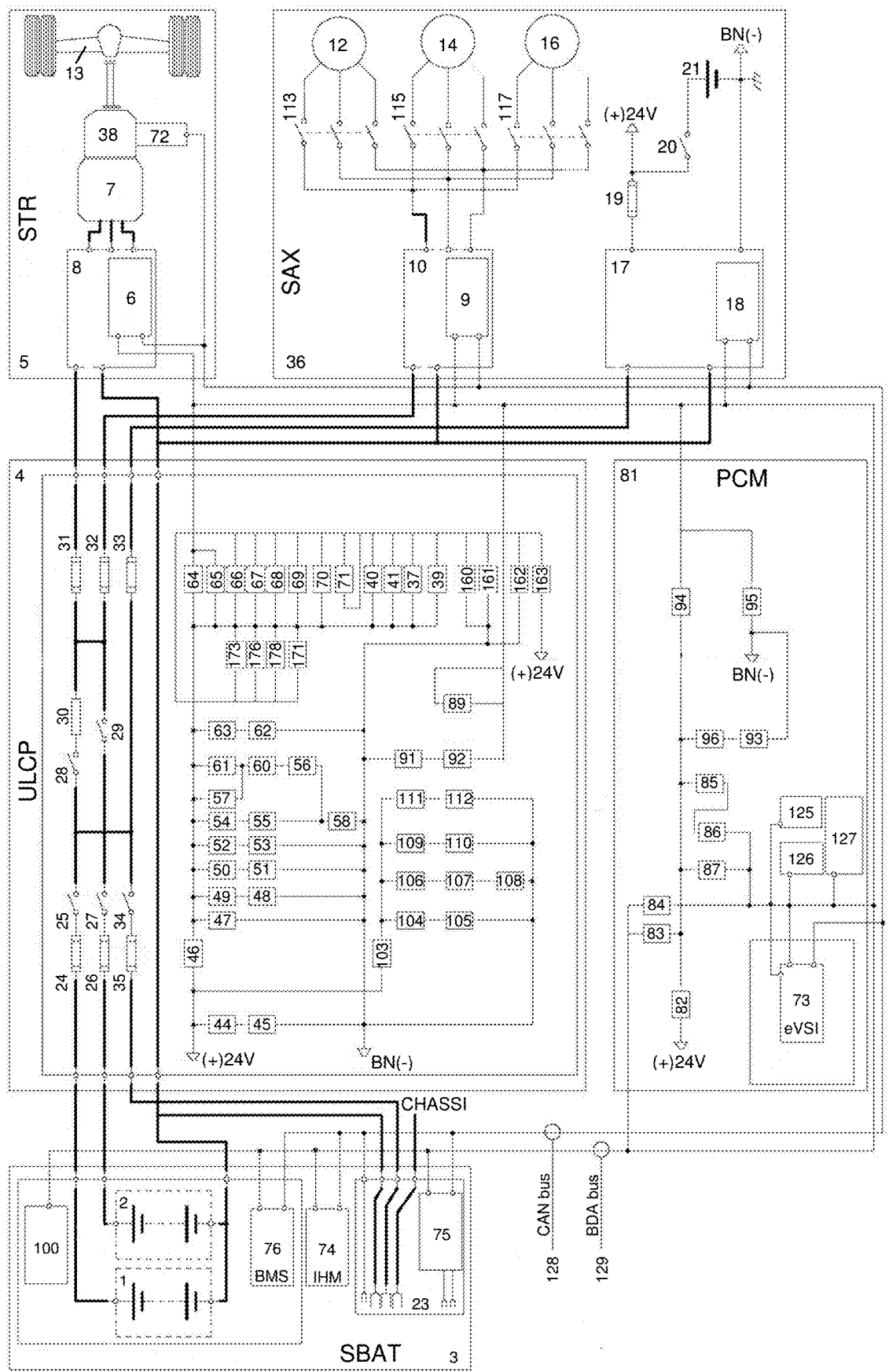

ELECTRIC VEHICLE POWER MANAGEMENT SYSTEM

CROSS-REFERENCE TO RELATED APPLICATIONS

The present application is a U.S. National Phase of PCT/BR2018/050055 filed on Mar. 2, 2018, claiming priority under 35 USC § 119 of Brazilian Patent Application No. BR 10 2018 001661 0 filed Jan. 26, 2018.

APPLICATION FIELD

The present invention applies to pure electric vehicles with a load capacity of from 8 to 13 tons.

STATE OF THE ART

With the frequent increase in pollution of the planet, mainly caused by greenhouse gases, there is an increasing need to make the exchange of fossil-fuel vehicles fueled by vehicles that do not emit greenhouse gases.

One of the most effective solutions to greenhouse gas emissions is purely electric vehicles because they do not work with the burning of any fuel and therefore do not emit gases.

In the state of the art there are already many electric vehicles and technologies involved, but the electric vehicles of the art, applied to automobiles, have been developed to serve small loads because one of the main limitations of the electric vehicles are the batteries because to have an electric vehicle with a great nominal range, many batteries are necessary, which makes the project unfeasible.

The advancement of battery technologies has allowed the development of vehicles with greater nominal range, however, large vehicles for the transportation of loads are still limited by the management of batteries.

BR102014006100A2 describes an electric vehicle system containing two engines, one for vehicle traction and another auxiliary for performing tasks such as plowing and lifting materials. In this document the system only describes the interaction between the electric motors and the power source or power sources through commutator under the management of a controller. There is no description of the management of the capacity of the energy sources, their temperature and managed power. This document does not specify and does not teach how this system can be adopted in load vehicles such as trucks, i.e., it does not describe a power management system for a load between 8 and 13 tons.

CA2836450A1 describes an adaptive power management and driver control system for modifying the driver output of the electric vehicle in real-time, comprising input sensors mounted on a vehicle which measures a plurality of conditions for the vehicle between the mass of the vehicle, road, vehicle speed, vehicle acceleration and door position, along with a digital electronic controller mounted on the vehicle that receives data from the input sensors, performs an algorithm using the data and produces efficient energy results for an electric motor vehicle. The sensors measure at least the mass of the vehicle and the degree of inclination of the road. Energy efficiency and reduced charging requirements result for the batteries in a certain route to the electrically driven vehicle.

EP2680434A1 discloses an electric vehicle which includes a motor unit which drives the wheels. The electric vehicle also includes a control system that controls the engine unit. The control system includes an inverter. The electric vehicle also includes a temperature sensor ($S_{ma}$) for measuring the temperature $T_{mc}$ of the engine coil (78) of the engine unit (6) or a temperature sensor ($S_{ia}$) to gauge the Tic temperature of the inverter. The electric vehicle also includes a limiter so that if the temperature $T_{mc}$ measured by the sensor ($S_{ma}$) exceeds the temperature limit of the motor coils, reduce the motor unit current to the derivative of $T_{mc}$/dt of the measured temperature $T_{mc}$ with time t drops to zero or below, or to, if the temperature $T_{ic}$ measured by the sensor ($S_{ia}$) exceeds the temperature limit of the inverter, limiting the current control to the inverter until the derivative $d_{Tic}$/dt of the temperature measured $T_{ic}$ with time t fall to zero or below.

US2013/0175022A1 discloses a thermal management system for an electric vehicle including a motor circuit for cooling a thermal load of a motor circuit, a cabin heating circuit for heating a cabin heater and a heating circuit battery to manage the temperature of a thermal load of a battery circuit. All these circuits can communicate fluidly with each other and a single radiator can cool the fluid of all these circuits.

US2013/0221916A1 discloses a operating multi-mode system for electric vehicles. The system includes means for the user to select the preferred mode of operation within a plurality of modes of operation which include at least one Battery Life Mode and a Standard Mode where the Battery Life Mode is configured to select parameters operation and load that emphasize the health and life of the battery in view of the vehicle's range and/or its performance. The system includes a thermal management system for maintaining the battery pack within a plurality of temperature ranges, and a charging system for recharging the battery pack of the vehicle for a plurality of minimum and maximum charge levels and a plurality charge rates.

US2014/0046524A1 discloses a battery control system for an electric vehicle including a battery pack which includes a dew point calculation module which receives at least a first signal indicative of moisture in the battery pack and a second signal indicative of the temperature of the battery pack, and calculating the dew point in the battery pack based on humidity and temperature. A cooling system control module receives the dew point and a required cooling temperature, sets a desired cooling temperature based on the dew point at the required cooling temperature, and selectively operates the cooling system of the battery pack based at the desired refrigeration temperature.

US2016/0159339A1 discloses a method and control system of operation of an idle motor are provided to improve the fuel efficiency of a vehicle by maintaining an efficient SOC of the battery and charge control during the engine connection for heating a vehicle. The method includes receiving an engine connection request to warm the vehicle and determining the condition of the road. A destination load power is determined and set as a value corresponding to the road condition and battery condition information. A basic idle RPM configured as a value corresponding to the road condition, destination load power, and external temperature are determined. A compensation RPM and a target inactivity RPM are determined by compensating the basic idle RPM by the compensating RPM to adjust the idle engine in the RPM of inactivity of the target determined during vehicle heating.

US2016/0318501A1 describes an adaptive power management and driver control system for modifying the output of the motor electric vehicle in real-time, including input sensors mounted on a vehicle which measures a plurality of vehicle conditions from the mass vehicle, highway slope, vehicle speed, vehicle acceleration and door position, together with a vehicle-mounted digital electronic controller that receives data from the input sensors, executes an algorithm using the data and produces resultant results energy-efficient with power output controls for an electric motor of the vehicle. The sensors measure at least the mass of the vehicle and the incline of the road. Energy efficiency and reduced charging requirements for the battery result from a particular route to the electrically driven vehicle.

US2013166119A1 discloses a method for thermal management of an electric vehicle and said vehicle. A controller is configured to regulate the temperature of a traction battery within an operating temperature range when the vehicle is in operation. The battery temperature is set within a charge temperature range when the battery is connected to the charger and power source and the ambient temperature is outside an ambient temperature range. The battery is preconditioned to the temperature of a battery when the ambient temperature is outside the ambient temperature range and the battery is connected to the charger and the power source. The cabin in the vehicle is preconditioned at cabin temperature when the vehicle is connected to the charger and the power source and the ambient temperature is outside the ambient temperature range.

However, none of the above referenced art documents describes a power management system applied to a pure electric propulsion electric vehicle; with powered exclusively by batteries; with regenerative electric braking; with a gross vehicle weight of between 8 and 13 tons; with net vehicle load capacity of between 4 and 6 tons; with a vehicle power consumption of 0.8 to 1 kWh/km; with nominal range between 80 and 120 km; taking into account the maximum ramp inclination between 20 and 25%; with recharge time of the batteries in up to 80% of the load in 2 to 3 hours; with recharge time of the batteries in up to 100% of the load in 3.5 to 4.5 hours; with a maximum speed of 80 km/h; and, being the vehicle equipped with automatic gearbox, air conditioning, and power steering.

SUMMARY OF THE INVENTION

The present invention aims to provide a power management system of a pure electric vehicle powered exclusively by batteries which allows the vehicle to carry a load of up to 13 tons.

To this end, the system of the present invention is provided with five blocks: a battery system (SBAT) 3, a control and power logic unit (ULCP) 4, a traction system (STR) (5), an auxiliary system (SAX) 36, and a driver's control panel (PCM) 81, where such blocks are interconnected by two buses, CAN bus (128) and Digital/Analog BDA (129). The battery system has two battery banks (1) and (2) in parallel which are monitored by the BMS (76). The BMS 76 checks whether the voltages at the output of the batteries are the same as the input of the inverter (8) and manages the use of the battery banks in conjunction with the eVSI (73) by operating the battery bank (1) or the battery bank (2) or both depending on the load conditions of each bank. The eVSI (73) coordinates the control and power logic unit (ULCP) (4) which, through its components, controls the flow of energy between the battery banks, the traction system (STR) (5) and the system (SAX) (36).

The system is driven and monitored by means of the driver's control panel (PCM) (81) located in the cab of the vehicle from which the features of the electric vehicle are driven.

The effectiveness of the present system is a result of the control logic of the control and power logic unit (ULCP) (4) which commutator the connection of the traction inverter (8), the auxiliary inverter (10), and the converter DC/DC (17) and the power to be applied to the traction motor according to the state of the battery banks (1) and (2), as well as the control of the state of charge and temperature of the batteries, where the minimum limit of load of the battery banks is 20% for vehicle operation and in case of detecting a charge below the system alerts the driver for the batteries to be charged.

BRIEF DESCRIPTION OF THE FIGURE

FIG. 01 shows the functional diagram of the power management system of the electric vehicle of the present invention. The diagram shows the blocks that make up the electric vehicle system and the connections and interactions of the elements of each block.

DETAILED DESCRIPTION OF THE INVENTION

The system of the present invention contains five blocks.

The Block (3) represents the battery system (SBAT) containing: two banks of batteries in parallel bank (1) and bank (2), a BMS module (Battery Monnitoring System) (76), an IHM display (74), a plug (23) for connection to the external battery charger, an interface module (75) and battery fans (100).

The Block (4) represents the control and power logic unit (ULCP) containing: a control (53); an emergency contact (44); the contacts (25), (27), (28), (29), (34), (39), (40), (41), (46), (48), (51), (55), (58), (59), (60), (62), (66), (67), (68), (69), (70), (71), (103), (112), (163), (176), (178); contactors (49), (50), (52), (54), (61), (64), (65), (104), (106), (109); fuses (24), (26), (31), (32), (33), (35); relays (37), (45), (47), (63), (89), (91), (105), (107), (108), (110), (160), (161), (162), (171), (173); a resistor (30); a brake sensor (92); a timer preload (57); and a relief valve for starting the compressor (111).

In the control and power logic unit (ULCP), the relay (45), when energized, connects the supply of the coils of the contactors and relays of the ULCP (4), as well as controls the control of the auxiliary inverter (10), contact of the drive (68), contact of the BMS (69) and contact (70) of the DC/DC converter. The emergency contact (44), when actuated by the emergency button (83), turns off the relay (45), which in turn, opens the contact (46) and commutator off all contactors and relays, in this way all vehicle system will be keyed of.

In this ULCP unit are the protection fuses of the battery banks (24) and (26), the STR drive system (31), the SAX auxiliary system (32), the dc/dc converter (33) and the charger batteries (35).

The relay (47), when energized, enables commuted on the contactors of the motors of the auxiliary system (12) (14) (16). The contactors (49) and (50) of the battery banks (1) and (2) will be energized respectively through the contacts (48) and (51) after checking the condition of the batteries by the BMS (Battery Monitoring System), being normal, the contactors (49) and (50) will be energized, closing the contacts (25) and (27), and the battery banks (1) and (2) will be connected to the ULCP.

An auxiliary contact of each of the contactors of the batteries (64) and (65) communicates through the control panel of the PCM driver (81) that the seat or the seats are connected.

The load contactor (52) will be energized through the control (53) when the system assumes the "Battery load mode" and the contact (34) will be closed to connect the external charger (not shown) to the ULCP (4).

The contactor (54) is the main contactor of the system and will be controlled by the contactor (55) to be energized when the input voltage in the traction inverter (8) is equal to the voltage of the battery banks (1) and (2), this same contact (55) also controls the contactor (54) to deenergize if a fault occurs in the traction inverter (8) through the relay (37).

The timer (57) shuts off the preload system in the event of a failure to start the vehicle starting logic. If after 3 seconds the voltage at the input of the inverter (8) does not reach the voltage value of the battery banks (01) and (02) the preload contactor (61) will be de-energized.

Therefore, the main contactor (54) will not be energized. When the load mode is selected, the contact (58) does not allow contactor energizing (54). The auxiliary relay (63) is energized by the contact (62) of the relay (56) which is parallel to the main contactor (54), this relay releases the energizing of the auxiliary and traction inverters (08) through the contacts (66) and (67).

The Block (5) represents the traction system (STR) comprising: a traction inverter (8), an inverter controller (6), an traction electric motor (7), a gearbox (38), an exchange controller (72), and a tractor shaft (13).

The Block (36) represents the auxiliary system (SAX) comprising: an auxiliary inverter (10), an inverter controller (9), a hydraulic pump motor and air conditioning compressor (12), an air compressor motor (14), a motor of the cooling system water pump (16), contacts (113), (115) and (117), a DC/DC converter (17), a converter controller (18), a battery protection fuse (19), a general battery key (20), and an auxiliary battery (21).

The Block (81) represents the driver's control panel (PCM) comprising: a chassis and body control system (eVSI) (73), a CAN bus (CAN) (128), a Digital/Analogical bus (BDA) (129), a ignition key (82), an emergency button (83), a "Battery Load mode" selector (84), a manual electrofan key (85), an electro-fan relay (86), a button (87) of traction inverter enable (87), a relay (93) [PCM] of parking brake, an enabled traction contact (94), a contact (95), a parking brake (96), a brake pedal (125), an accelerator pedal (126), and a gear (127).

The system of the present invention manages the entire power system of an electric charging vehicle, such as a truck, this electric vehicle being pure.

The technical characteristics of the vehicle managed by the system are:

Pure electric propulsion;
Battery powered;
Regenerative electric braking;
Gross vehicle weight of 8 to 13 tons;
Net load capacity of the vehicle between 4 and 6 tons;
Vehicle power consumption of 0.8 to 1 kWh/km;
nominal range between 80 and 120 km;
Maximum ramp between 20 and 25%;
Charging time of the batteries in up to 80% of the load in 2 to 3 hours;
Recharge time of batteries up to 100% of the charge in 3.5 to 4.5 hours;
Maximum speed of 80 km/h;
Vehicle equipped with automatic gearbox;
Vehicle equipped with air conditioning; and
Vehicle equipped with power steering.

Description of System Operation
Logical Sequence of energizing the Electric Truck Systems Operation Mode All communications via CAN bus are represented on the CAN bus (128) and digital and analog communications are represented on the bus BDA (129).

When the ignition key (82) on the driver's control panel [PCM] is keyed on, the relay (45) of the power control logic unit [ULCP] is energized.

The relay (45) [ULCP], when energized, connects the contactor and relay coil supply via the contact (46) [ULCP] as well as powers the auxiliary drive controller (9) of the auxiliary system [SAX] and the controller of the traction inverter (6) of the traction system [STR] through contact (68) [ULCP], BMS (76) [SBAT], contact (69) [ULCP], DC/DC converter (17) [SAX] and contact (70) [ULCP].

At the output of the DC/DC converter (17) [SAX] there is a protection fuse (19) and a general battery key (20) [SAX], this general key when disconnected, turns off all control feeds vehicle.

Therefore, the relay (45) [ULCP] is the relay that initiates the energizing logic of the systems and also shuts off the entire system, the contact (44) [ULCP] actuated by the emergency button (83) [PCM] is in series with the relay (45) [ULCP] to turn off the entire system in the event of an emergency. The BMS (76) of the battery system [SBAT] when energized, checks the condition of the batteries and, if these are with their standard loads, energizes the relays (160) and (161) [ULCP] that, through the contacts (48) and (51) [ULCP] energizes the contactors (49) and (50) [ULCP] by connecting the battery banks through power contacts (25) and (27) [ULCP].

Since there are two parallel battery banks, the BMS (76) [SBAT] checks the state of charge and voltage of the battery banks (1) and (2) [SBAT] and connects the two banks only if these parameters are equal to or within the pre-set threshold, such as, for example, 20% of the load capacity.

If there is an imbalance between the banks, the BMS (76) [SBAT] only powers one bank through the relay (48) or the relay (51) [ULCP], the highest voltage and the load state.

In this condition, as there is only one battery bank operating, the traction system must be adjusted with less power (limited operation), in this case the contacts (40) and (41) [ULCP] request the inverter controller module (6) [STR] a reduction of power in the traction electric motor (7) [STR].

When one of the power contacts (25) or (27) [ULCP] or both contacts are closed, the DC/DC converter (17) [SAX] is energized and starts supplying power to the $24V_{DC}$ system and keeps charging the auxiliary batteries (21) [SAX].

The preload timer (57) [ULCP] is energized as soon as the ignition key (82) [PCM] is keyed on. The timer contact (60) [ULCP] energizes the preload contactor (61) [ULCP] which in turn closes the contact (28) [ULCP] and, through the preload resistor (30) [ULCP], loads the filter capacitors (not shown) of the inverters (8) [STR] and (10) [SAX], when the capacitor voltage reaches the same voltage level as the battery banks, the relay (37) [ULCP] is energized by the inverter controller [6] [STR] and its contact [ULCP] energizes the main contactor [54] [ULCP] which connects the battery bank to the system via the power contactor [ULCP].

The main contactor (54) also energizes the relay (63) which controls the energizing of the auxiliary inverter (10) [SAX] via the contact (66) [ULCP], so that the auxiliary inverter (10) is energized and passes to generate a three-phase network $220V_{AC}$. This network feeds auxiliary motors (12), (14) and (16) [SAX] which are energized through the contacts (113), (115) and (117) [SAX] and the contactors (104), (106), and (109) [ULCP] respectively. The contactor control will depend on the contact (103) of the relay (47) [ULCP] that is energized when the ignition key (82) [PCM] is keyed on. In the event of an overload on the auxiliary motors (12), (14) and (16), the thermal relays (105), (107), (108) and (110) will turn off their respective contactors (104), (106) and (109).

The relief valve for starting of the air compressor (111) is energized by the timed contact in 12 seconds (112) of the auxiliary inverter (10). This time ensures that the compressor will accelerate without load, avoiding the "hydraulic wedge". Therefore, when the compressor is energized the valve directs the compressed air to the atmosphere and only after the compressor reaches nominal rotation the valve is de-energized and the compressed air starts to pressurize the pneumatic system of the truck.

The vehicle is then with the auxiliary system (36) [SAX] in operation, the DC/DC converter (17), the hydraulic pump (12), the air compressor (14), and the cooling system and air conditioning (16) (if connected by the system operator).

For the electric motor (7) to be activated, two conditions must be fulfilled by the traction inverter controller (6) [STR]. The first condition is accomplished by closing the contact [ULCP] of the relay (63) [ULCP] that occurs when the main contactor (54) [ULCP] is energized when the condition of the batteries (1) and (2), the second condition is accomplished by actuation of the button (87) [PCM] so that a digital signal is sent to the eVSI module [73] [PCM] and this sends via the CAN bus (128) a signal for the inverter control module (6) [STR] is enabled, and the vehicle will be able to drive by selecting the gear (127) [PCM] and activating the accelerator pedal (126) [PCM].

In this condition, the relay (89) [ULCP] will be energized through the contacts (94) and (95) which indicate that the traction inverter (06) [STR] is enabled with the energizing of the relay (89), the coolant system electric fan will start (system not shown in the FIGURE). If there is a need to key off the electric fan, the key (85) may inhibit the relay circuit (89).

Between the electric motor (07) and the tractor axle (13) there is an automatic gearbox (38) of 6 forward speeds, neutral and reverse. The gearbox multiplies the torque required for the vehicle to achieve ramp-up and final-speed climb performance, the tractor shaft (13) has a reduction and transfers the output torque of the electric motor set (7) and automatic gearbox (38) for the tires.

The control module (72) communicates with the traction inverter control module (6) to synchronize the gear shifts, i.e., for each gear change, the control module (72) sends a signal to the inverter module (6) which inhibits traction, thus smoothing the gear shifts.

When the vehicle is moving, when it takes off the foot of the accelerator (126) [PCM] a small electric braking rate is applied and the traction system (5) begins to regenerate energy for the batteries (1) and (2). By pressing the brake (125) this rate increases proportionally to the position of the pedal, increasing regeneration or energy recovered in the brakes.

This kinetic energy recovery system is known by the acronym KERS (Kinetic Energy Recovery System). This system allows to recover up to 30% of the energy consumed by the vehicle.

With the vehicle in operation, the BMS (76) [SBAT] is always active by monitoring the balance of the battery bank cells (1) and (2) [SBAT], current and temperature. In the event of a fault, the BMS (76) [SBAT] energizes the relays (160) and (161) [UPCL] that turn the contactors (49) and (50) [UPCL] by disconnecting the battery banks (1) and (2).

If the temperature in the batteries reaches the temperature between 41 and 50° C., preferably 45° C., the BMS (76) [SBAT] controls the relay (162) [ULCP] which through the contact (163) [ULCP] energizes the fans of the batteries (100) [SBAT] and when the temperature drops to 40° C. the fans will be turned off.

When the energy of the battery banks (1) and (2) reaches 20% an alert signal will warn the driver of the vehicle in relation to the state of charge, and when it reaches 10% the BMS (76) controls the turned off of the vehicle.

Load Mode of the Batteries:

In mode charge of the batteries, the ignition key (82) [PCM] must be keyed on, the load mode selector (84) [PCM] must be pressed, the relay (93) [LPCM] must be energized with the applied parking brake (96) [PCM] and the relay contact (92) (93) energizes the relay (91) which energizes the relay (171) [ULCP], the plug (23) (SBAT) connected and the battery banks (1) and (2) after checking of the BMS (76) [SBAT] must be connected via the contacts (25) or (27) [ULCP] or both.

In load mode relay (171) [ULCP] will be energized and relay contact (58) [ULCP] (171) will not allow main contactor (54) [ULCP] to energize, while maintaining contact (29) [ULCP] is open, so the traction and auxiliary system will not be energized.

When the battery banks (1) and (2) are connected, the respective contacts (176) and (178) [ULCP] send a digital signal to the eVSI module (73) which in turn, via the CAN network (128), informs the interface module (75) [SBAT] that the external charger (not shown) can be turned on, and the vehicle is ready to recharge the batteries (1) and (2).

The interface module 75 [SBAT] informs the BMS (76) [SBAT] that it is in the load mode through relay (173) [ULCP] and also operates the relay (171) [ULCP] which by its connects the external charger to the vehicle through the power contactor 34 [ULCP], which in turn gives the feedback to the interface module (75) through the contact (71) that the contactor (34) is energized.

The BMS (76) [SBAT] sends via CAN (128), the limits of load, current and voltage to the interface module (75) [SBAT] which, in turn, sends this information to the external loader.

When the battery charge (1) and (2) reaches 100%, the BMS (76) [SBAT] sends this message to the interface module (75) [SBAT] which, in turn, disconnects the external charger.

After charging is completed, the plug (23) is disconnected from the external charger and the load mode selector (84) is deactivated.

At this time, the vehicle is capable of traction.

In the event of a load interruption, the load mode selector (84) [PCM] is deactivated, the vehicle key (82) [PCM] is keyed off and the plug (23) [SBAT] is disconnected.

If the battery banks (1) and (2) are unbalanced, the BMS (76) [SBAT] connects the bank of lower load and voltage and starts charging. When this bank reaches the same load state as the other bank, the BMS (76) [SBAT] connects the second bank in parallel and the two banks continue to be reloaded.

During the charging, the BMS (76) [SBAT] monitors the current, the voltage and the temperature, in the event of an error, it sends a message to interrupt the load and opens the power contacts (25) and (27) [ULCP].

Component Listing

| No. | Item | Block |
|---|---|---|
| (001) | Batteries | SBAT |
| (002) | Batteries | SBAT |
| (003) | Batteries system | SBAT |
| (004) | Control and power logic unit | ULCP |
| (005) | Traction system | STR |
| (006) | Controller of the traction inverter | STR |
| (007) | Traction electric motor | STR |
| (008) | Traction inverter | STR |
| (009) | Auxiliary inverter controller | SAX |
| (010) | Auxiliary inverter | SAX |
| (012) | Hydraulic pump motor and air conditioning compressor | SAX |
| (013) | Tractor shaft | STR |
| (014) | Air compressor motor | SAX |
| (016) | Auxiliary motor of the cooling system water pump | SAX |
| (017) | Converter DC/DC | SAX |
| (018) | Converter controller | SAX |
| (019) | Fuse of the battery | SAX |
| (020) | General key of the batteries | SAX |
| (021) | Auxiliary battery | SAX |
| (023) | Plug for connection | ULCP |
| (024) | Fuse | ULCP |
| (025) | Power contact | ULCP |
| (026) | Fuse | ULCP |
| (027) | Power contact | ULCP |
| (028) | Power contact | ULCP |
| (029) | Power contact | ULCP |
| (030) | Preload resistor | ULCP |
| (031) | Fuse | ULCP |
| (032) | Fuse | ULCP |
| (033) | Fuse | ULCP |
| (034) | Power contact | ULCP |
| (035) | Fuse | ULCP |
| (036) | Auxiliary system (SAX) | SAX |
| (037) | Relay | ULCP |
| (038) | Gearbox | STR |
| (039) | Contact | ULCP |
| (040) | Contact | ULCP |
| (041) | Contact | ULCP |
| (044) | Emergency contact | ULCP |
| (045) | Relay | ULCP |
| (046) | Contact | ULCP |
| (047) | Relay | ULCP |
| (048) | Contact | ULCP |
| (049) | Contactor of the battery bank | ULCP |
| (050) | Contactor of the battery bank | ULCP |
| (051) | Contact | ULCP |
| (052) | Load contactor | ULCP |
| (053) | Control | ULCP |
| (054) | Main contactor | ULCP |
| (055) | Contact | ULCP |
| (056) | Relay | ULCP |
| (057) | Timer preload | ULCP |
| (058) | Contact | ULCP |
| (060) | Timer contact | ULCP |
| (061) | Preload contactor | ULCP |
| (062) | Contact | ULCP |
| (063) | Relay | ULCP |
| (064) | Battery contactor | ULCP |
| (065) | Battery contactor | ULCP |
| (066) | Contact | ULCP |
| (067) | Contact | ULCP |
| (068) | Traction contact | ULCP |
| (069) | Contact of the BMS | ULCP |
| (070) | Contact of the converter DC/DC | ULCP |
| (071) | Contact | ULCP |
| (072) | Exchange controller | STR |
| (073) | Body and chassis control system eVSI (Electric Vehicle System Integrator) | PCM |
| (074) | Display IHM of the battery system | SBAT |
| (075) | Interface module with the charger external | SBAT |
| (076) | BMS (Battery Monitoring System) | SBAT |
| (081) | Driver's control panel | PCM |
| (082) | Ignition key | PCM |
| (083) | Emergency button | PCM |
| (084) | "Load mode" selector | PCM |
| (085) | Manual electro-fan key | PCM |
| (086) | electro-fan relay | PCM |
| (087) | Button "Enable traction" | PCM |
| (089) | Relay of the automatic electro-fan | ULCP |
| (091) | Relay of "Load mode" | ULCP |
| (092) | Applied parking brake sensor | ULCP |
| (093) | Relay of parking brake | PCM |
| (094) | Enabled traction contact | PCM |
| (095) | Contact | PCM |
| (096) | Parking brake | PCM |
| (100) | Battery fans | SBAT |
| (103) | Contact | ULCP |
| (104) | Hydraulic pump contactor and air conditioning | ULCP |
| (105) | Thermal relays | ULCP |
| (106) | Air compressor contactor | ULCP |
| (107) | Thermal relay | ULCP |
| (108) | Thermal relay | ULCP |
| (109) | Water pump contactor of the inverter cooling system | ULCP |
| (110) | Thermal relay | ULCP |
| (111) | Relief valve for starting the compressor | ULCP |
| (112) | Contact | ULCP |
| (113) | Contact | SAX |
| (115) | Contact | SAX |
| (117) | Contact | SAX |
| (125) | Brake pedal | PCM |
| (126) | Accelerator pedal | PCM |
| (127) | Gear | PCM |
| (128) | CAN bus (CAN) | PCM |
| (129) | Digital/Analogical bus (BDA) | PCM |
| (160) | Relay | ULCP |
| (161) | Relay | ULCP |
| (162) | Relay | ULCP |
| (163) | Contact | ULCP |
| (171) | Relay | ULCP |
| (173) | Relay | ULCP |
| (176) | Contact | ULCP |
| (178) | Contact | ULCP |

The invention claimed is:

1. An electric vehicle power management system comprising:—a battery system (SBAT) comprising a first bank of batteries and a second bank of batteries arranged in parallel, a battery monitoring system (BMS) module, an IHM display, a plug for connection to an external battery charger, an interface module and battery fans;

a control and power logic unit (ULCP) comprising: a control, a plurality of contacts including first, second, third, fourth, fifth, sixth, seventh, eighth, ninth, tenth, eleventh, twelfth, thirteenth, fourteenth, fifteenth, sixteenth, seventeenth, eighteenth, nineteenth, twentieth, twentyfirst, twentysecond, twentythird, twentyfourth, twentyfifth, twentysixth and twentyseventh contacts, a plurality of contactors including first, second, third, fourth, fifth, sixth, seventh, eighth, ninth and tenth contactors, a plurality of fuses including first, second, third, fourth, fifth and sixth fuses, a plurality of relays including first, second, third, fourth, fifth, sixth, seventh, eighth, ninth, tenth, eleventh, twelfth, thirteenth, fourteenth and fifteenth relays, a resistor, a brake sensor, a timer preload, and a relief valve for starting a compressor, a traction system (STR) comprising: a traction inverter, an traction inverter controller, a traction electric motor, a gearbox, an exchange controller, and a tractor shaft;

an auxiliary system (SAX) comprising: an auxiliary inverter, an auxiliary inverter controller, a hydraulic pump motor and air conditioning compressor, an air compressor motor, a motor of the cooling system water pump, twenty-eighth, twentyninth and thirtieth contacts, a DC/DC converter, a converter controller, and an auxiliary battery; and a driver's control panel (PCM) comprising: a body and chassis control system (eVSI), a CAN bus, a Digital/Analogical bus (BDA), an ignition switch, a "Battery Load mode" selector, a manual electro-fan switch, an electro-fan relay, a button to enable the traction inverter, a relay of the parking brake, a thirtyfirst contact, a parking brake actuator, a brake pedal, an accelerator pedal, and a gear selector;

and configured:

wherein the second relay, when energized, connects a supply of the contactors and relay coils of the ULCP, as well as powers the control of an auxiliary inverter the nineteenth contact, the twentieth contact, the twenty-first contact, wherein the third relay, when energized, connects first, second and third contactors of motors of the SAX, so that when the first and second contactors of the battery banks are respectively energized via the tenth and eleventh contacts after checking the condition of the batteries by the BMS is normal closing the first and second contacts, thereby connecting the battery banks to the ULCP, and an auxiliary contact of each of first and second contactors communicates via the driver's control panel (PCM) that the seat or seats are connected, wherein the third contactor is energized through a control, when the system assumes the "Load mode of the batteries" and the fifth contact is closed to connect the external charger to the ULCP, wherein the fourth contactor is the main contactor of the system and is driven by the twelfth contactor to energize when the input voltage in the traction inverter equals the voltage of the battery banks and the twelfth contactor controls the fourth contactor to de-energize through the first relay if a fault occurs in the traction inverter, wherein a timer keys off the timer preload in the event of a fault in the start-up of the vehicle starting logic, and if after 3 seconds the voltage at the input of the traction inverter does not reach the voltage value of the batteries banks the fifth contactor is de-energized;

and wherein the system operates in two modes, mode of operation and mode of charging the batteries.

2. The system according to claim 1, that manages an electric vehicle powered only by electric propulsion with battery power, and having: regenerative electric braking, vehicle gross weight from 8 to 13 tons, net vehicle load capacity from 4 to 6 tons, vehicle power consumption from 0.8 to 1 kWh/km, nominal range from 80 to 120 km, maximum ramp from 20 to 25%, recharging time of the batteries by up to 80% of the load in 2 to 3 hours, recharging time of batteries up to 100% of the load in 3.5 to 4.5 hours, maximum vehicle speed of 80 km/h automatic gearbox, air conditioning, and power steering.

3. The system according to claim 1, in which all digital communications are carried out through the CAN bus and analog communications are performed through the BDA bus.

4. The system of claim 1, wherein the gearbox is an automatic gearbox that provides six forward, a neutral position and a reverse speed and the gearbox is disposed between the traction electric motor and the tractor shaft.

5. The system according to claim 4, wherein the gearbox multiplies the torque required for the vehicle to achieve ramp-up and final-speed climb performance, and the tractor shaft provides reduction and transfer of the output torque of the traction electric motor and automatic gearbox to the tires.

6. The system according to claim 1, wherein a control module sends a signal to the traction inverter controller inhibiting the traction at the time of the gear changes.

7. The system according to claim 1, that is configured so that, when in operation the brake pedal is pressed, the amount of electrical energy directed to the batteries increases proportionally to the position of the brake pedal.

8. The system of claim 1 that is configured so that, when the vehicle in operation, the BMS monitors the balance, the current and the temperature of the batteries, and in case of failure the BMS, the SBAT energizes the second and third relays of the ULCP to turn off the first and second contactors of the ULCP thereby disconnecting the batteries from the remainder of the system.

9. The system of claim 1 that is configured so that, if the temperature in the batteries is between 41 and 50° C., the BMS controls the thirteenth relay of the ULCP so that by via a thirtysecond contact in the ULCP, battery blowers are energized and, when the temperature falls to 40° C. the battery blowers are turned off.

10. The system of claim 1 that is configured so that if in operation the battery bank charge reaches 20%, an alert signal warns a driver of the vehicle in relation to the state of charge, and, when the charge reaches 10%, the BMS controls a vehicle shutdown.

11. The system according to claim 1, that is configured so that, in operation the second relay of the ULCP initiates the logic of the energizing of the systems and also turns off the entire system.

12. The system according to claim 1, wherein the DC/DC converter of the SAX has a protection fuse at its output and the SAX includes a general battery switch configured to shut off all vehicle control feeds when the general battery switch is opened.

13. The system according to claim 1, further comprising an emergency button on the PCM and an emergency contact in the ULCP that, when actuated by the emergency button, turns off the second relay which, in turn opens the ninth contact, and commutates off all contactors and relays, turning off all vehicle systems.

14. A method for managing power in an electric vehicle comprising:

connecting an ignition switch on a driver's control panel (PCM) to energize a first relay of a control and power logic unit (ULCP) of the electric vehicle, connecting a supply of contactors and a first relay of the ULCP through: a first contact to supply an auxiliary inverter controller of an auxiliary system (SAX) and a traction inverter controller of a traction system (STR) through a second contact of the ULCP, a battery management system (BMS) through a third contact, a battery system (SBAT), through a fourth contact, a fifth contact of the ULCP, a DC/DC converter (SAX) through a sixth contact and a seventh contact of the ULCP, checking the status and voltage of batteries of the SBAT, by means of the BMS, and if these two parameters are equal to or within the minimum 20% of the load capacity of the batteries, energizing second and third relays of the ULCP so that, by eighth and ninth contacts of the ULCP first and second contactors of the ULCP are energized, connecting the banks of the battery via power contacts of the ULCP, and if there is an imbalance between the banks, energizing only one of the battery banks via a fourth relay or a fifth relay of the ULCP, and if there is a high voltage and high load state, adjusting the traction system with less power, the tenth and eleventh contacts of the ULCP requiring the inverter controller to reduce power in the traction electric motor of the STR, energizing the DC/DC converter of the SAX via at least one of the power contacts of the ULCP, and depending on the condition of the battery banks, supplying power to a 24 volt DC system and maintaining loaded auxiliary batteries of the SAX, energizing a preload timer and preload contactor of the ULCP via a timer contact of the ULCP, which in turn closes a twelfth contact of the ULCP and, through a preload resistor of the ULCP, loads the filter capacitors of inverters of the STR and of the SAX, and when the voltage of the capacitors reaches the same voltage level as the battery banks, a sixth relay of the ULCP is energized by the inverter controller of the STR and a thirteenth contact of the ULCP energizes a third contactor of the ULCP that connects the battery banks to the system via a first power contactor of the ULCP, energizing a seventh relay via the third contactor and energizing the auxiliary inverter of the SAX through a thirteenth contact of the ULCP, and generating a three-phase 220 VAC network by powering auxiliary motors of the SAX via fourteenth, fifteenth and sixteenth contacts of the SAX and fourth, fifth and sixth contactors of the ULCP, respectively, where control of the fourteenth, fifteenth and sixteenth contacts is dependent on the energizing of a seventeenth contact of a seventh relay of the ULCP that is energized when the ignition switch of the PCM is switched on, and in the event of an overload on the auxiliary motors, thermal relays are turned off by opening the fourth, fifth and sixth contactors, energizing one or more of a relief valve for starting an first air compressor by a timed contact in 12 seconds of the auxiliary inverter by connecting the SAX, the DC/DC converter, a hydraulic pump, a second air compressor, and a cooling and air conditioning system, if any of these are connected to the system by the system operator, closing an eighteenth contact of the ULCP of the eighth relay of the ULCP after the energizing the third contactor of the ULCP when the condition of the batteries state is satisfied, and pushing a first button of the PCM by sending a digital signal to an eVSI module of the PCM, which in turn sends a signal through a CAN bus to enable the inverter controller of the STR, satisfying the conditions for the traction electric motor to start up, and selecting a gear by a gear selector of the PCM and turning on an accelerator pedal of the PCM] by energizing an eighth relay of the UPCL through nineteenth and twentieth contacts, indicating that the traction inverter of the STR is enabled and optionally activating an electro-fan of the cooling system via a switch on the PCM.

15. The method according to claim 14, wherein a small electric braking rate is applied to the vehicle in motion when the accelerator of the PCM is released and the STR directs electrical energy to the batteries.

16. The method according to claim 14, in which the load state of the batteries is determined by the steps:
switching on the ignition switch of the PCM,
pressing a load mode selector in the PCM,
applying a parking brake in the PCM,
energizing an eighth relay of the PCM via a twentieth contact of a ninth relay, which energizes a tenth relay of the ULCP,
connecting a plugin the SBAT after checking the batter by the BMS connected via at least one of the power contacts of the ULCP,
energizing the tenth relay and a twentyfirst contact not allowing the third contactor of the ULCP to energize, by keeping the first power contactor of the ULCP open, by holding the traction system and auxiliary system de-energized,
sending a digital signal to the eVSI module via twenty-second and twentythird contacts of the ULCP, which in turn informs an interface module of the SBAT via a CAN network that the external charger can be switched on, enabling the vehicle to recharge the batteries, wherein the interface module of the SBAT informs the BMS that it is in load mode through an eleventh relay of the ULCP and also actuates the tenth relay of the ULCP, which in turn, connects the external charger to the vehicle through a second power contactor of the ULCP, which in turn gives the feedback to the interface module of the SBAT through a twentyfourth contact that the second power contactor is energized, and the BMS sends, via the CAN, the limits of load, current and voltage to the interface module of the SBAT] which, in turn, sends this information to the external charger,
monitoring the battery charge via the BMS, and when the load reaches 100%, sending a signal to the interface module of the SBAT to disconnect the external charger,
disconnecting the plug from the external charger and deactivating the load mode selector.

17. The method according to claim 16, wherein in the load mode of the batteries, further comprises the following steps in the event of a load interruption:
disabling the load mode selector on the PCM, turning off the ignition switch and disconnecting the plug from the SBAT, and if battery banks are unbalanced, connecting the lowest load and voltage bank through the BMS and starting the load, and, when the connected bank reaches the same load state as another bank, connecting the other bank in parallel via the BMS and continuing to recharge the two banks.

18. The method according to claim 17, in which during the recharging, the BMS monitors the current, voltage and temperature of the batteries, and in the event of an error, the BMS sends a message to interrupt the load and open the power contacts of the ULCP.

* * * * *